United States Patent [19]

Mirabel

[11] Patent Number: 5,606,523
[45] Date of Patent: Feb. 25, 1997

[54] NON-VOLATILE PROGRAMMABLE BISTABLE MULTIVIBRATOR IN PREDEFINED INITIAL STATE FOR MEMORY REDUNDANCY CIRCUIT

[75] Inventor: Jean-Michel Mirabel, Gardanne, France

[73] Assignee: SGS-Thomson Microelectronics S.A., Saint Genis Pouilly, France

[21] Appl. No.: 380,737

[22] Filed: Jan. 30, 1995

[30] Foreign Application Priority Data

Jan. 31, 1994 [FR] France .................................. 94 01034

[51] Int. Cl.$^6$ .................................................. G11C 7/00
[52] U.S. Cl. ...................... 365/185.05; 365/49; 365/154; 365/185.07; 365/200
[58] Field of Search ............................. 365/185, 49, 200, 365/185.01, 185.05, 185.07, 154

[56] References Cited

U.S. PATENT DOCUMENTS

| | | | |
|---|---|---|---|
| 3,936,811 | 2/1976 | Horninger | 365/49 X |
| 4,207,615 | 6/1980 | Mar | 365/95 |
| 4,400,799 | 8/1983 | Gudger | 365/95 |
| 5,070,480 | 12/1991 | Caywood | 365/49 |
| 5,111,427 | 5/1992 | Kobayashi et al. | 365/49 |
| 5,371,697 | 12/1994 | Yamada | 365/49 |

FOREIGN PATENT DOCUMENTS

| | | | |
|---|---|---|---|
| 0525680 | 2/1993 | European Pat. Off. | G11C 16/04 |
| 0530376 | 3/1993 | European Pat. Off. | G11C 16/04 |

OTHER PUBLICATIONS

IEEE Journal of Solid–State Circuits, vol. 22, No. 5, Oct. 1987 New York US, pp. 684–692 Ciaoca et al. "A Million-Cycle CMOS 256K EEPROM".

*Primary Examiner*—Son T. Dinh
*Attorney, Agent, or Firm*—David M. Driscoll; James H. Morris

[57] ABSTRACT

The disclosure relates to memories in integrated circuit form. A programmable non-volatile memory cell of the bistable type is described. This memory cell can take one stable state or another depending on whether either one of two floating-gate transistors of the cell has been programmed. In the initial state, neither of the two transistors is programmed so that the cell cannot remain in this state and at least one of the transistors has to be programmed. To avoid this, there is provided an additional transistor controlled by the output of the cell to set up imbalance in the cell which can then take a well-determined stable state even if no transistor is programmed, while at the same time ensuring that there is no consumption of current by the cell even in this case. The disclosure can be applied to the redundancy circuits of large-capacity memories to memorize the defective addresses. It makes it possible to avoid having to program the cells when the memory has no defective addresses.

48 Claims, 1 Drawing Sheet

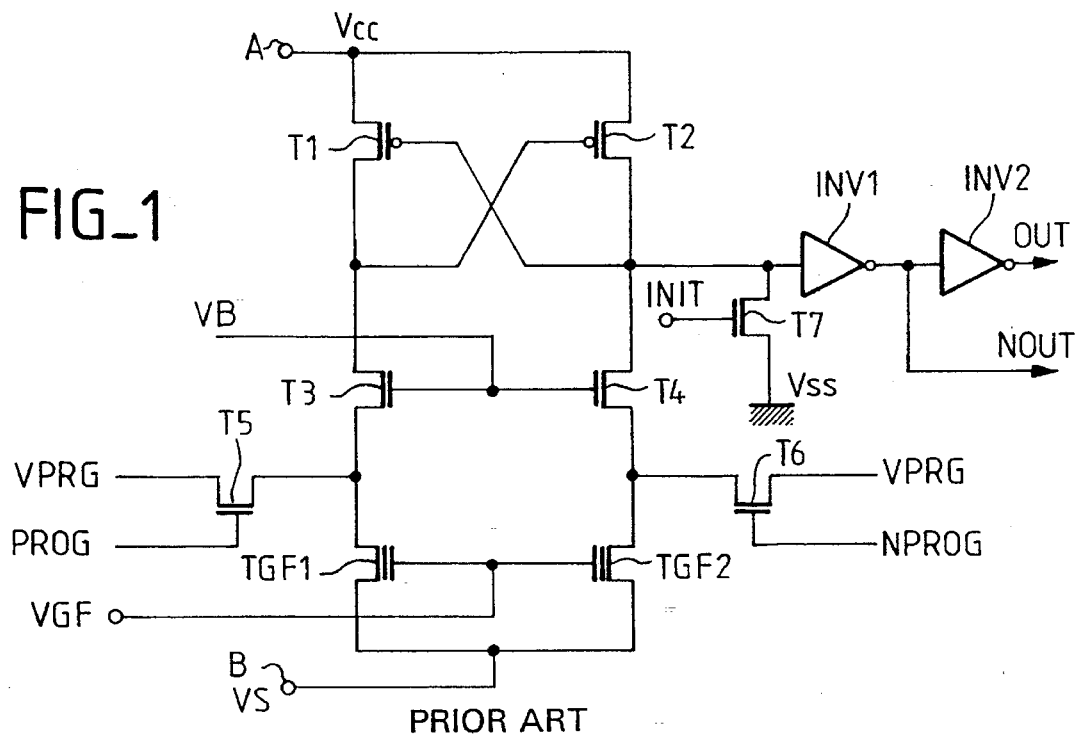
FIG_1
PRIOR ART
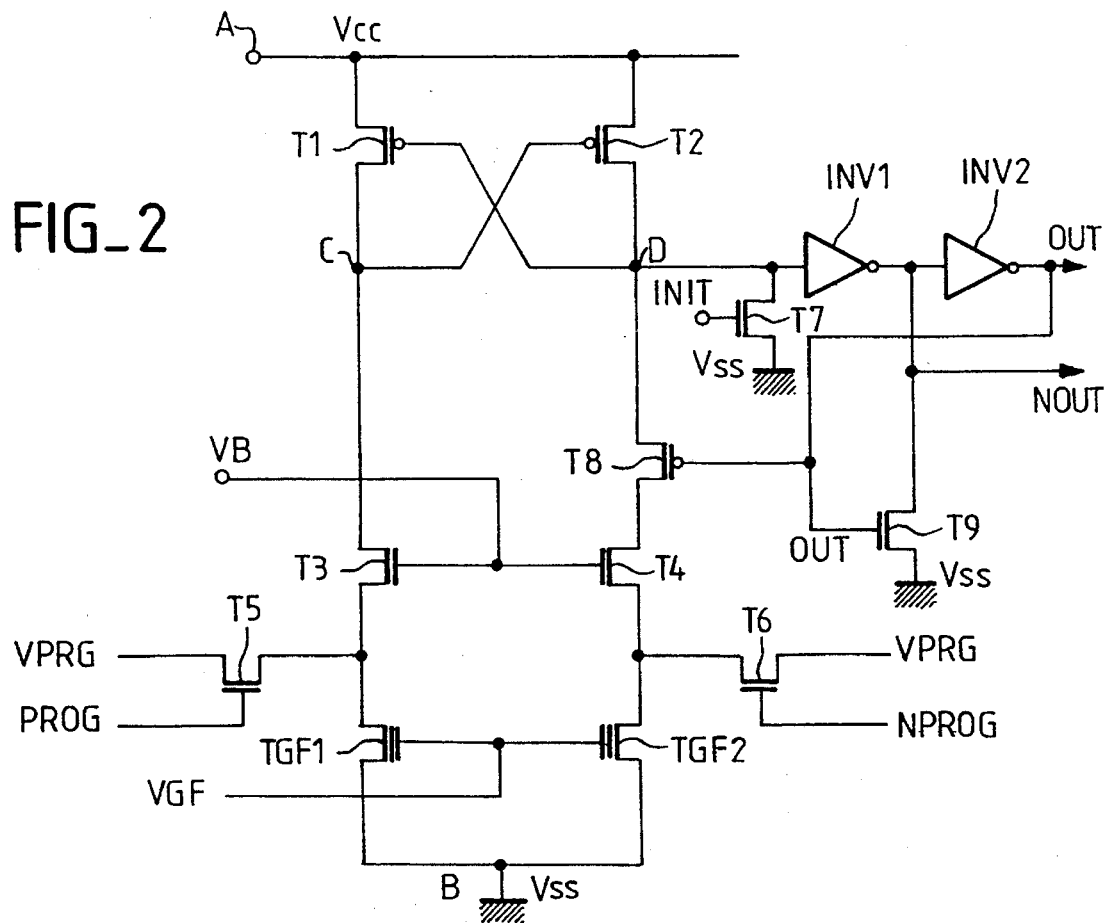
FIG_2

NON-VOLATILE PROGRAMMABLE BISTABLE MULTIVIBRATOR IN PREDEFINED INITIAL STATE FOR MEMORY REDUNDANCY CIRCUIT

BACKGROUND OF THE INVENTION

1. Field of the Invention

The invention relates to integrated circuits. An object of the invention is a non-volatile electrically programmable bistable multivibrator. It is designed essentially, though not exclusively, for use in a redundancy circuit of a memory in integrated circuit form.

2. Discussion of the Related Art

To provide for a clear understanding of the invention in the context in which it has been conceived, a brief reminder shall first of all be given of the principles of redundancy circuits currently used in large-capacity memories.

The redundancy circuits of a memory are implemented when defects appear in the rows (word lines used to address the memory) or the columns (bit lines conveying the data elements to be read or written in the memory).

For example, if a column is defective, it is replaced by a redundancy column as follows: the address of the defective column is memorized in a defective address memory; this defective address memory is a memory of the type that is addressable by its contents (hereinafter called CAM or contents addressable memory); whenever an address is applied to the main memory, this address is also applied to the CAM. If the address applied is identical to the address memorized, a redundancy circuit is put into operation and acts to disconnect the defective column and to connect a redundant column in its place in a way that is invisible to the user.

In practice, according to the organization of the main memory, if a column is defective, it is rather a group of columns containing this defective column that will be replaced by a group of redundancy columns: in general, if a group of columns is defined by an address bit of the large-capacity memory, it is this group of columns that will be replaced as a whole. Hereinafter, for simplicity's sake, reference shall be made, in the description, to the replacing of only one column rather than to the replacing of a group of columns.

For a main memory of several megabits, the possibility of repairing several defects is foreseen. There are therefore as many redundancy columns as there are defective columns or rows which it should be possible to repair. With each redundancy column, there is associated a respective CAM containing the address of a defective column. If N defects are to be repaired, N redundancy columns and N CAMs are needed. Typically, N=36 for a four-megabit or sixteen-megabit memory.

If a column of the main memory is designated by an M-bit address (for example M=5), then each CAM contains at least M+1 bits: M bits to define the address of a defective column and one validation bit to indicate that the redundancy circuit corresponding to this CAM should actually be activated when the defective address is applied to the CAM.

To make CAMs, the first devices used were groups of physical fuses, fused electrically or fused by laser beam, each fuse representing an address bit or a validation bit. These fuses had drawbacks (relating to reliability, bulkiness, consumption, and difficulty of programming) and were soon replaced by non-erasable non-volatile memory cells. The latter too had drawbacks (they consumed substantial current) and there was a gradual trend towards the use of programmable bistable multivibrators comprising two floating-gate transistors for each address bit or validation bit.

FIG. 1 shows a prior art non-volatile programmable bistable multivibrator constituting a storage cell of a defective address bit (or a validation bit), and therefore constituting one of the M−1 cells of a defective address CAM.

The output OUT of this cell is at a logic level 0 or 1 depending on the state in which the bistable multivibrator is programmed. This output therefore defines a value of an address bit (or the value of the validation bit).

If the cell corresponds to one of the M defective address bits, the output of each cell of these M address bits is applied to an input of an exclusive-OR gate (not shown). The exclusive-OR gate receives, at another input, a corresponding address bit received by the main memory. The outputs of the exclusive-OR gates corresponding to the different address bits of one and the same defective address memory are applied to an input of a NOR gate (not shown). The output of this NOR gate gives a logic 1 level only when there is coincidence between all the address bits applied and all the corresponding bits of the defective address memory. The output of the NOR gate is validated by the output of the memory cell corresponding to the validation bit, for example by means of an AND gate (not shown). The output of the AND gate is the output of the CAM and is used to put a redundancy path into operation whenever the address applied to the main memory corresponds to the defective address recorded.

In general, there are N memories with defective addresses, for example N=36. During the testing of the main memory, the detection of a defective column activates the storage of the address of this column in one of the CAMs. The different CAMs are thus successively programmed as and when the defects are detected. During the normal operation of the main memory, the addresses of this memory are applied simultaneously to all the CAMs. If there is correspondence between the applied address and the address stored in one of them, the redundancy path corresponding to this address is activated.

To enable the programming of a defective address in a CAM, it is therefore provided that a respective address bit of the main memory will be applied to each cell of the CAM. The programming is done upon a command of the testing apparatus in the event of the detection of a defect at the address being tested.

The individual memory cell shown in FIG. 1 has two arms with a floating-gate transistor TGF1, TGF2 in each arm. The arms are arranged so as to form a bistable multivibrator as soon as one of these two transistors is programmed. The state of the bistable multivibrator, represented by the output OUT and corresponding to an address bit or a validation bit, is then a function of that one of the two transistors which is programmed. At the outset, the two transistors are in a non-programmed or blank state. During the testing of the memory, one of the two transistors is programmed to obtain either a 0 or a 1 at the output OUT of the cell, thus defining a definitive stable state 0 or 1 of the cell.

More specifically, the cell of FIG. 1 has two identical arms in parallel between a supply terminal A (potential Vcc of the order of 3 volts) and a terminal B. The terminal B is at a zero potential VS in reading or programming mode and may also be taken to a high potential VS (12 volts) in erasure mode if an erasure mode is planned (flash EPROM). In series in each arm, there is a P channel transistor (T1, T2), an N channel transistor (T3, T4), and a floating-gate transistor (TGF1, TGF2). The gate of the P channel transistor (T1, T2) of one of the arms is connected to the drain of the P channel transistor (T2, T1) of the other arm. The gates of the N channel transistors (T3, T4) are connected together to acommon potential VB whose value depends on the mode ofoperation (about 1.8 volts in reading mode; 0 volts in programming or erasure to have one volt at the drain of the cells in reading mode). The transistors T3 and T4 are insulation transistors in order to prevent the transmission, to the transistors T1 and T2, of the relatively high voltages applied to the floating-gate transistors in programming or erasure mode. The gates of the floating-gate transistors TGF1, TGF2 are connected to a common potential VGF depending on the operation (about 3 volts in read mode, about 12 volts in programming mode). The source of these transistors is connected to the node B (potential VS). The drain potentials of the floating-gate transistors are controlled by transistors T5 and T6 respectively, enabling either the connection of the drain to a programming potential VPRG (transistor T5 or T6 conductive) or the leaving of the drain in high impedance (transistor T5 or T6 off). In programming mode, the gate of the transistor T5 is controlled by a programming signal PROG and the gate of T6 by a complementary signal NPROG. As a result, a choice is made, depending on the state of the signal PROG, of that transistor of the two floating transistors which must be programmed and that transistor which must remain blank. In reading mode, the drain of the transistors T5 and T6 remains in a state of high impedance, the voltage VPRG being not applied to these drains.

The cell is called a bistable cell because it has one stable state among two possible states, the stable state that it takes depending on that one of the two transistors that has been programmed. The state of the cell is readat the drain of one of the P channel transistors (T2 for example). This drain is connected to the input of a first inverter INV1 followed by a second inverter INV2. The output of INV2 is the output OUT of the cell. The output of INV1 is used as a complementary output NOUT if it is needed.

Finally, a supplementary transistor T7 may make it possible, solely in test mode, in order to avoid the floating nodes when T3 and T4 are off, to place the input of the inverter INV1 temporarily at the ground (for an initialization of the state of the cell at each power-on-reset operation). The gate of this transistor is activated by an initializing rectangular-wave signal INIT produced by a standard power-on-reset circuit (not shown).

SUMMARY OF THE INVENTION

The present invention is aimed at improving the prior art bistable cells to make them easier to use, notably in applications of the type described here above (memory redundancy).

It is therefore proposed herein to modify the programmable cells with two floating-gate transistors, of the type constituting a bistable multivibrator after programming, namely cells that then have two possible stable states, with the state that is taken by the cell depending on the programming done. According to the invention, the cell has means to set up an imbalance in the state of the non-programmed cell to give an output state that is dictated in a definite way even before programming, and to prevent a consumption of current of the cell in reading mode even if the cell is not programmed.

In a practical embodiment, the cell may have two arms. The arms are preferably crossed to achieve a bistable function. Each arm has a floating-gate transistor. One of the two arms furthermore has a transistor whose conduction is controlled by the output of the cell, this transistor preventing the circulation of current in this arm before programming while at the same time forcing the bistable multivibrator into a determined state in which there is no consumption of current in the other arm.

Each arm may have a P channel transistor in series with the floating-gate transistor of this arm with, possibly, in addition an insulation transistor in series between the P channel transistor and the floating-gate transistor. The drain of the P channel transistor of one of the arms is preferably connected to the gate of the P channel transistor of the other arm.

Preferably, a looping transistor having its gate controlled by the output of the cell, is connected in feedback mode so asto maintain this output in the state that is taken naturally by the bistable multivibrator before programming.

The invention is particularly advantageous because it makes it possible to program only those cells that must have a state other than the state dictated before programming. In a cell such as that of FIG. 1, it is not possible to leave the cell in a non-programmed state because the result thereof would be both uncertainty over the state of the cell and current consumption.

Indeed, with the cell of FIG. 1, the preprogramming state is uncertain: the bistable multivibrator is balanced on the whole and may flip over randomly from one side to another. The direction of the flip-over depends, for example, on the small differences in threshold voltage of the two floating-gate transistors. Furthermore, this cell consumes current when reading for the two floating-gate transistors are blank, hence conductive in reading mode. The result thereof is that the cell has to be programmed in one direction or another: to memorize a zero bit, it is necessary to program one of the transistors whereas to memorize a one bit, it is necessary to program the other transistor of the cell. However, in the application to a memory having N possibilities of redundancy with addresses encoded on M bits, it is then necessary to carry out Nx(M+1) programming operations irrespectively of the defects to be corrected. Even an entirely flawless memory has to be undergo these Nx(M+1) programming operations, which takes up time unnecessarily.

With the invention, all that will be programmed will be the validation bits that have to be placed in a determined logic state (for example 0) but not the validation bits that can remain in the initial state (1). Similarly all that will be programmed will be the defective address bits at 0 but not the address bits at 1.

Furthermore, there will be no current consumption since the two arms of the cell will be off (non-conductive) in the stable state taken by the cell even if it has not been programmed.

BRIEF DESCRIPTION OF THE DRAWINGS

Other features and advantages of the invention shall appear from the following detailed description, made with reference to the appended figures, of which:

FIG. 1 already described shows a known storage cell;

FIG. 2 shows an embodiment of a cell according to the invention.

DETAILED DESCRIPTION

A non-volatile storage cell according to the invention is shown in FIG. 2. It is essentially constituted like the cell of FIG. 1, with two additional transistors controlled by the output OUT of the cell. The description made with reference to FIG. 1 remains valid for FIG. 2 with the following modifications.

A transistor T8, which is preferably a P channel transistor, is inserted between the drain of the transistor T2 (node D in FIG. 2) and the drain of the transistor T4, these drains having hitherto been joined. The gate of this transistor T8 is connected to the output OUT of the cell so that the transistor T8 is on if OUT is at the logic level 0 and so that T8 is off if OUT is at the logic level 1.

Furthermore, provision is also made preferably for an additional transistor T9, preferably an N channel transistor, parallel-connected between the input of the inverter INV2 and the ground. It makes it possible to place this input at zero. This transistor is controlled by the output OUT, so that the passage of OUT to 1 causes the resetting of the input of INV2, thus confirming the output OUT at 1 (and the output NOUT at 0). The transistor T9 is therefore used to keep the output OUT at 1 if it tends to pass therein as is actually the case when the bistable multivibrator is turned on.

The cell may have two possible states: a non-programmed state or a programmed state. The way in which the programming is done shall be indicated further below.

a) Non-programmed cell

Because of the presence of the transistor T8 in series with the transistor T2, the potential of the node D tends to rise to a higher level than the potential of the node C when the voltage is turned on, namely when a voltage Vcc is applied to the node A, the node B being grounded. It is furthermore possible to bring about an imbalance in the dimensions of the transistor T1 with respect to the transistors T2 and T4 in order to boost this phenomenon.

The conduction of the transistor T1 then tends to diminish and that of the transistor T2 to increase, further accentuating this imbalance of potential between the nodes C and D. The bistable multivibrator tends naturally to place the output OUT at 1, thus tending to turn the transistor T8 off, further raising the potential of the node or in any case preventing it from falling. If the output OUT goes to 1, the transistor T9 becomes conductive, placing the input of the inverter INV2 at 0 and therefore confirming the output OUT at 1 by looping.

It is therefore seen that when the power is turned on, the output OUT necessarily goes to 1. The state of the bistable multivibrator is set at 1 even without programming of either of the floating-gate transistors.

b) Programmed cell

The programming of the cell consists in programming the transistor TGF1, namely the floating-gate transistor of the arm that does not have the additional transistor T8. This programming makes the transistor TGF1 non-conductive for the gate voltage that is applied to it (about 3 volts in reading mode). The other transistors of the two arms are initially all conductive. The bistable multivibrator is therefore in a state of imbalance and the turning on of the voltage raises the potential of the node C to a higher level than that of the potential of the node D. The bistable multivibrator gets placed naturally in the stable state OUT=0.

Consequently, the bistable multivibrator has a first pre-programming stable state (OUT=1) and a second post-programming stable state (OUT=0). It is not necessary to program the transistor TGF2 to have the stable state OUT=1. However, if the transistor TGF2 is programmed, a stable state of the bistable multivibrator is also obtained. This is the same state (OUT=1) as for a non-programmed cell.

Furthermore, in the two stable states, there is no permanent consumption of power: in the state OUT=0, it is as in the case of the cell of FIG. 1. The transistor TGF1 is off and prevents the flow of current in the first arm. The transistor T2 is off and prevents the flow of current in the second arm. In the state OUT=1, the transistor T1 is off and prevents the flow of current in the first arm. The transistor T8 is off and prevents the flow of current in the second arm.

When the current supply of the integrated circuit is cut off, there may be uncertainties as regards the operation of all the elements of the circuit and a power-on-reset circuit is generally provided. With regard to the memory cell of FIG. 2, it is provided that this circuit (not shown) will give an initialization rectangular-wave signal INIT to the gate of the transistor T7 when the power is reset. This rectangular-wave signal temporarily places the potential of the node D at 0 and therefore makes the output OUT go to 0. Then, the rectangular-wave signal is released and the bistable multivibrator takes the state dictated to it by its programming state: OUT=1 if the cell is not programmed or if TGF2 is programmed, OUT=0 if TGF1 is programmed.

To program the transistor TGF1, a voltage VPRG of about 6 volts is applied to the drain of the transistor T5, the gate of this transistor receiving an ON signal PROG while the gate of the transistor T6 receives a complementary signal NPROG that leaves it off. To program the transistor TGF2 (if desired), it is the gate of the transistor T6 that receives an ON signal to transmit the voltage VPRG, the gate of the transistor T5 receiving a complementary signal. The cells or groups of cells that should not have to be programmed either in one direction or in the other do not receive the voltage VPRG at the drains of the transistors T5 and T6. These drains remain in a state of high impedance.

In a defective address memory, the programming of the cells will not be done if there is no defective address to be recorded, but if a defective address has to be stored, the cells could be programmed like those of FIG. 1 by using both the transistor TGF1 for the address bits 0 and the transistor TGF2 for the address bits 1. This is why a signal PROG representing an address bit or a validation bit is applied to the transistor T5 and a complementary signal NPROG is applied to the transistor T6.

However, if the number of defects to be corrected in the main memory is smaller than the number of defective address memories available, it will not be necessary to program the unused address memory cells. In particular, in the case of a memory with no defect, all the CAM cells could be left in the unprogrammed state.

The invention is applicable also with variants, notably those that are described in the patent U.S. patent application entitled Non-Volatile Programmable Bistable Multivibrator, Programmable By The Source, For Memory Redundancy Circuit by Jean-Michel Mirabel, and French patent application Serial No. 94 01035 and 94 01036, each of which is incorporated herein by reference. In particular, it can be provided that the programming will be done by applying a voltage of 5 to 7 volts to the source (and not zero volts), and a zero voltage to the drain of the floating-gate transistor which has to be programmed (and not 5 to 7 volts), the drain of the other transistor remaining in a state of high impedance. Again, it can be provided that insulation transistors are inserted between the transistors T5, T6 respectively and the drain of the corresponding floating-gate transistor. These transistors are controlled by a common signal CAMSEL that makes these transistors conductive only when the cell has to be programmed (at the same time as the other cells corresponding to a same defective address to be stored). When other groups of cells have to be programmed or when the operation is in reading mode, the insulation transistors are off.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A programmable memory cell with two floating-gate transistors, of the type constituting a bistable multivibrator whose state is defined by the programming of one of the two transistors, wherein said cell has means to set up an imbalance in said cell when said cell is in a non-programmed state in order to output a predetermined signal before programming, and to prevent a consumption of current of the cell in reading mode even if the cell is not programmed.

2. A memory cell according to claim 1, wherein a looping transistor having its gate controlled by an output of the cell is connected in feedback mode so as to maintain this output in a predetermined state before programming.

3. A memory in integrated circuit form comprising a main memory and redundancy circuits to correct defects of the main memory, wherein said memory in integrated circuit form comprises memory cells according to claim 2 to store addresses of defective elements of the main memory.

4. A memory in integrated circuit form comprising a main memory and redundancy circuits to correct defects of the main memory, wherein said memory in integrated circuit form comprises memory cells according to claim 1 to store addresses of defective elements of the main memory.

5. A memory cell according to claim 1, wherein the cell has two arms that are crossed to achieve a bistable function, each arm comprising a floating-gate transistor, a first arm of the two arms furthermore comprising a transistor whose conduction is controlled by an output of the cell and prevents a circulation of current in the first arm before programming while at the same time forcing the bistable multivibrator into a determined state in which there is no consumption of current in the other arm.

6. A memory cell according to claim 5, wherein a looping transistor having its gate controlled by an output of the cell is connected in feedback mode so as to maintain this output in a predetermined state before programming.

7. A memory in integrated circuit form comprising a main memory and redundancy circuits to correct defects of the main memory, wherein said memory in integrated circuit form comprises memory cells according to claim 6 to store addresses of defective elements of the main memory.

8. A memory in integrated circuit form comprising a main memory and redundancy circuits to correct defects of the main memory, wherein said memory in integrated circuit form comprises memory cells according to claim 5 to store addresses of defective elements of the main memory.

9. A memory cell according to claim 5, wherein each arm has a P channel transistor in series with one of the floating-gate transistors, and an insulation transistor in series between the P channel transistor and the floating-gate transistor, the drain of the P channel transistor of one of the arms being connected to the gate of the P channel transistor of the other arm.

10. A memory cell according to claim 9, wherein a looping transistor having its gate controlled by the output of the cell is connected in feedback mode so as to maintain this output in a predetermined state before programming.

11. A memory in integrated circuit form comprising a main memory and redundancy circuits to correct defects of the main memory, wherein said memory in integrated circuit form comprises memory cells according to claim 10 to store addresses of defective elements of the main memory.

12. A memory in integrated circuit form comprising a main memory and redundancy circuits to correct defects of the main memory, wherein said memory in integrated circuit form comprises memory cells according to claim 9 to store addresses of defective elements of the main memory.

13. A programmable memory cell comprising:

a programmable, non-volatile bistable multivibrator having first and second arms and wherein the second arm is cross-wired with the first arm, wherein the first arm comprises a first floating-gate transistor and the second arm comprises a second floating-gate transistor, and an imbalance circuit operatively connected to the second arm of the programmable bistable multivibrator.

14. A memory cell according to claim 13, wherein the first and second arms each have a P channel transistor in series with one of the floating-gate transistors and an insulation transistor in series between the P channel transistor and the one of the floating-gate transistors, the drain of the P channel transistor of one of the arms being connected to the gate of the P channel transistor of the other arm.

15. A memory cell according to claim 13, wherein the imbalance circuit comprises a transistor connected in the second arm and whose conduction is controlled by an output of the cell.

16. A memory cell according to claim 13 wherein the imbalance circuit comprises means for preventing the circulation of current in the first arm and for at the same time forcing the bistable configuration into a determined state in which there is no consumption of current in the second arm.

17. A memory cell according to claim 13, further including a looping transistor having its gate controlled by an output of the cell and being connected in feedback mode so as to maintain the output in a predetermined state before programming.

18. A memory in integrated circuit form comprising a main memory and redundancy circuits to correct defects of the main memory, wherein said memory in integrated circuit form comprises memory cells according to claim 13 to store addresses of defective elements of the main memory.

19. A memory cell according to claim 13 wherein:

the first arm comprises a second floating-gate transistor, the imbalance circuit comprises means, including a transistor connected in the second arm and whose conduction is controlled by an output of the cell, for preventing the circulation of current in the first arm and for at the same time forcing the bistable configuration into a determined state in which there is no consumption of current in the second arm, the first and second arms each have a P channel transistor in series with one of the floating-gate transistors and an insulation transistor in series between the P channel transistor and the floating-gate transistor, the drain of the P channel transistor of one of the arms being connected to the gate of the P channel transistor of the other arm, and the memory cell further includes a looping transistor having its gate controlled by an output of the cell and being connected in feedback mode so as to maintain the output in a predetermined state before programming.

20. A memory in integrated circuit form comprising a main memory and redundancy circuits to correct defects of the main memory, wherein said memory in integrated circuit form comprises memory cells according to claim 19 to store addresses of defective elements of the main memory.

21. Programmable memory cell means comprising:

bistable multivibrator means responsive to programming to store one of two states, and means to set up an imbalance in the state of the cell means to give a predetermined output state before programming, and to prevent a consumption of current of the cell means in reading mode even if the cell means is not programmed.

22. A memory cell means according to claim 21, wherein the bistable multivibrator means comprises two arm means that are crossed to achieve a bistable function, each arm means comprising a floating-gate transistor means, and wherein one of the arm means further comprises transistor means whose conduction is controlled by output means of the cell means and is for preventing the circulation of current in the one of the arm means before programming while at the same time forcing the bistable multivibrator means into a determined one of the states in which there is no consumption of current in the other arm means.

23. A memory cell means according to claim 21, further including looping transistor means having gate means controlled by output means of the cell means connected in feedback mode so as to maintain the output means in the predetermined state before programming.

24. A memory means in integrated circuit form comprising a main memory means and redundancy circuit means to correct defects of the main memory means, wherein said memory means in integrated circuit form comprises memory cell means according to claim 1 to store the addresses of defective elements of main memory means.

25. A memory cell means according to claim 21, wherein the bistable multivibrator means comprises two arm means that are crossed to achieve a bistable function, each arm means comprising a floating-gate transistor means, and wherein one of the arm means further comprises transistor means whose conduction is controlled by output means of the cell means and is for preventing the circulation of current in the one of the arm means before programming while at the same time forcing the bistable multivibrator means into a determined one of the states in which there is no consumption of current in the other arm means, and further including looping transistor means having gate means controlled by the output means of the cell means connected in feedback mode so as to maintain the output means in the predetermined state before programming.

26. A memory means in integrated circuit form comprising a main memory means and redundancy circuit means to correct defects of the main memory means, wherein said memory means in integrated circuit form comprises memory cell means according to claim 25 to store addresses of defective elements of the main memory means.

27. A method of operating a series of non-volatile bistable memory cells each having one or two states, comprising:

providing an imbalance in each of the non-volatile bistable memory cells to place them in a first one of the states of the cells, writing to a first plurality of the cells to change the state of each of the cells in the first plurality from the first one of the states to a second one of the states, wherein the step of writing operates by programming a floating gate of a first transistor in the cell, and reading the states of the first plurality of the cell.

28. The method of claim 27 further including the steps of:

leaving a second plurality-of the cells in their first one of the states, and reading the states of the second plurality of cells.

29. The method of claim 27:

further comprising the step of determining which of the cells are needed, to perform a redundancy operation in a memory connected to the bistable memory cells wherein the step of writing to a first plurality of the cells writes only to the cells determined to be needed in the step of determining, and further including leaving the ones of the cells that are not needed cells in their first one of the states.

30. The method of claim 27 further including the step of powering up the cells and wherein the step of powering up the cells overlaps in time with the step of providing an imbalance.

31. The method of claim 27 further including the step of confirming the imbalance by a feedback loop.

32. The method of claim 27 wherein the step of providing an imbalance includes controlling an imbalance transistor in the cell by an output of the cell.

33. The method of claim 27 wherein the step of providing an imbalance includes providing an imbalance between the size of an output transistor in the cell and the size of other transistors in the cell.

34. The method of claim 27 further including the step of accessing redundant memory cells based on the output of the step of reading.

35. The method of claim 27 further including the steps of writing to a second plurality of the cells to set the state of each of the cells in the second plurality to the first one of the states, and reading the states of the second plurality of the cells.

36. The method of claim 27 further including the steps of:

leaving a second plurality of the cells in their first one of the states, reading the states of the second plurality of cells, determining which of the cells are needed for performing a redundancy operation in a memory connected to the bistable memory circuit wherein the step of writing to a first plurality of the cells writes only to the needed cells, leaving the ones of the cells that are not needed for performing a redundancy operation in a memory connected to the bistable memory circuit in their first one of the states, powering up the cells and wherein the step of powering up the cells overlaps in time with the step of providing an imbalance, confirming the imbalance by a feedback loop, and accessing redundant memory cells based on the output of the step of reading, and wherein:

the step of writing operates by programming a floating gate of a first transistor in the cell, and the step of providing an imbalance includes controlling an imbalance transistor in the cell by an output of the cell.

37. The method of claim 36 further including the steps of writing to a third plurality of the cells to set the state of each of the cells in the third plurality to the first one of the states, and reading the states of the third plurality of the cells.

38. The method of claim 37 wherein the step of providing an imbalance includes providing an imbalance between the size of an output transistor in the cell and the size of other transistors in the cell.

39. The method of claim 36 wherein the step of providing an imbalance includes providing an imbalance between the size of an output transistor in the cell and the size of other transistors in the cell.

40. A programmable memory cell comprising:

a programmable, non-volatile bistable multivibrator having first and second arms and wherein the second arm is cross-wired with the first arm, and an imbalance circuit operatively connected to the second arm of the programmable bistable multivibrator, and wherein the first and second arms each have a P channel transistor in series with a floating-gate transistor and an insulation transistor in series between the P channel transistor and the floating-gate transistor, the drain of the P channel transistor of one of the arms being connected to the gate of the P channel transistor of the other arm.

41. A programmable memory cell comprising:

a programmable, non-volatile bistable multivibrator having first and second arms and wherein the second arm is cross-wired with the first arm, wherein the first arm comprises a second floating-gate transistor, wherein the first and second arms each have a P channel transistor in series with one of the floating-gate transistors and an insulation transistor in series between the P channel transistor and the floating-gate transistor, the drain of the P channel transistor of one of the arms being connected to the gate of the P channel transistor of the other arm an imbalance circuit operatively connected to the second arm of the programmable bistable multivibrator, wherein the imbalance circuit comprises means, including a transistor connected in the second arm and whose conduction is controlled by an output of the cell, for preventing the circulation of current in the first arm and for at the same time forcing the bistable configuration into a determined state in which there is no consumption of current in the second arm, and a looping transistor having its gate controlled by an output of the cell and being connected in feedback mode so as to maintain the output in a predetermined state before programming.

42. A memory in integrated circuit form comprising a main memory and redundancy circuits to correct defects of the main memory, wherein said memory in integrated circuit form comprises memory cells according to claim 41 to store addresses of defective elements of the main memory.

43. A method of operating a series of non-volatile bistable memory cells each having one or two states, comprising:

providing an imbalance in each of the non-volatile bistable memory cells to place them in a first one of the states of the cells, wherein the step of providing an imbalance includes controlling an imbalance transistor in each of the cells by an output of the cell, powering up the cells and wherein the step of powering up the cells overlaps in time with the step of providing an imbalance, confirming the imbalance by a feedback loop, writing to a first plurality of the cells to change the state of each of the cells in the first plurality from the first one of the states to a second one of the states, wherein the step of writing operates by programming a floating gate of a first transistor in the cells, determining which of the cells are needed for performing a redundancy operation in a memory connected to the bistable memory circuit, wherein the step of writing to a first plurality of the cells writes only to the needed cells, reading the states of the first plurality of the cell, leaving a second plurality of the cells in their first one of the states, leaving the ones of the cells that are not needed for performing a redundancy operation in a memory connected to the bistable memory circuit in their first one of the states, reading the states of the second plurality of cells, and accessing redundant memory cells based on the output of the step of reading.

44. The method of claim 43 further including the steps of writing to a third plurality of the cells to set the state of each of the cells in the third plurality to the first one of the states, and reading the states of the third plurality of the cells.

45. A method of operating a series of non-volatile bistable memory cells each having one or two states, comprising:

providing an imbalance in each of the non-volatile bistable memory cells to place them in a first one of the states of the cells, determining which of the cells are needed to perform a redundancy operation in a memory connected to the bistable memory cells, writing to a first plurality of the cells to change the state of each of the cells in the first plurality from the first one of the states to a second one of the states, wherein the step of writing to a first plurality of the cells writes only to the cells determined to be needed in the step of determining, further including leaving the ones of the cells that are not needed cells in their first one of the states, and reading the states of the first plurality of the cells 46. A method of operating a series of non-volatile bistable memory cells each having one or two states, comprising:

providing an imbalance in each of the non-volatile bistable memory cells to place them in a first one of the states of the cells, wherein the step of providing an imbalance includes providing an imbalance between the size of an output transistor in the cell and the size of other transistors in the cell.

writing to a first plurality of the cells to change the state of each of the cells in the first plurality from the first one of the states to a second one of the states, and reading the states of the first plurality of the cell.

47. A memory in integrated circuit form comprising a main memory and redundancy circuits to correct defects of the main memory, wherein said memory in integrated circuit form comprises memory cells according to store addresses of defective elements of the main memory, each of the programmable memory cells comprising:

a programmable, non-volatile bistable multivibrator having first and second arms and wherein the second arm is cross-wired with the first arm, and an imbalance circuit operatively connected to the second arm of the programmable bistable multivibrator.

48. A method of operating a series of non-volatile bistable memory cells each having one or two states, comprising:

providing an imbalance in each of the non-volatile bistable memory cells to place them in a first one of the states of the cells, writing to a first plurality of the cells to change the state of each of the cells in the first plurality from the first one of the states to a second one of the states, reading the states of the first plurality of the cells, and accessing redundant memory cells based on the output of the step of reading.

* * * * *